United States Patent [19]
Jeong

[11] Patent Number: 5,926,423
[45] Date of Patent: Jul. 20, 1999

[54] WAFER BURN-IN CIRCUIT FOR A SEMICONDUCTOR MEMORY DEVICE

[75] Inventor: Dong Sik Jeong, Kyoungki-do, Rep. of Korea

[73] Assignee: Hyundai Electronics Industries Co., Ltd., Ichon, Rep. of Korea

[21] Appl. No.: 08/964,647

[22] Filed: Nov. 5, 1997

[30]     Foreign Application Priority Data

Nov. 6, 1996 [KR]    Rep. of Korea ...................... 96-52253

[51] Int. Cl.⁶ .................................................. G11C 7/00
[52] U.S. Cl. ........................... 365/201; 365/200; 365/203
[58] Field of Search .................................... 365/201, 203, 365/200

[56]              References Cited

U.S. PATENT DOCUMENTS 5,255,229  10/1993  Tanaka et al. ...................... 365/203 X
5,357,193  10/1994  Tanaka et al. ...................... 365/201 X
5,657,282   8/1997  Lee ......................................... 365/201

FOREIGN PATENT DOCUMENTS 2 287 326   9/1995   United Kingdom .

Primary Examiner—Huan Hoang
Attorney, Agent, or Firm—Thelen Reid & Priest LLP

[57]              ABSTRACT

A wafer burn-in circuit for a semiconductor memory device which can detect defected cells in an early stage and increase a yield by applying a stress to bit lines in a wafer state to detect the defected cells and repair the same according to the present invention, is disclosed. To this end, a wafer burn-in circuit for a semiconductor memory device according to the invention includes an equalizing means for bit line for equalizing said bit lines at a standby operation stage, wherein the equalizing means for bit line is controlled by a first precharge signal for bit line. A stress inputting means for bit line is provided to input a stress voltage to the bit lines at a wafer burn-in operation stage, wherein the stress inputting means for bit line is controlled by a second precharge signal for bit line. A stress transferring means for bit line is also provided to make its output to be in a floating state at an normal operation stage, whereas it outputs a stress voltage to the stress inputting means for bit lines at the wafer burn-in operation stage.

3 Claims, 6 Drawing Sheets ial test has not been performed in a wafer state due to the high costs, but generally performed in a packaged state by applying a stress to the semiconductor memory device at a long period, using a high voltage (hereinafter, referred to as "burn-in voltage"). According to the conventional burn-in test, as the integrity of the semiconductor memory device to be tested is greater, the test costs thereof increases accordingly. Further, since the repairing can not be performed in the packaged state as mentioned above, the entire yield is deteriorated due to the stress which is occurred during the burn-in test.

In the meantime, in the conventional burn-in test, the yield may be improved by detecting a failure mainly at the word lines in the cells, that is, the gate oxide layer and then repairing them. However, the failures due to the stress in the word lines and the bit lines and the junction stress between the bit lines can not be improved.

In practice, since the burn-in test for the semiconductor memory device is generally performed by enabling the word lines first and alternately varying a high or low level of the cell data applied to the word lines or the bit line junction, while reading and/or writing the cell data from and/or to the cell, the presence of the stress applied to the bit lines is required. However, the conventional burn-in test was a technique which is not able to apply the stress to the bit lines.

Therefore, according to the conventional burn-in test as mentioned above, although the burn-in stress has already been given in the wafer state, since the burn-in test in the packaged state is continuously proceeded, there is a drawback that the advantageous effects of the wafer burn-in test can not be obtained, which results in the difficulty in improving the entire burn-in test time for the semiconductor memory device.

SUMMARY OF THE INVENTION

Therefore, it is an object of the invention to solve the problem as mentioned above and provide a wafer burn-in circuit for a semicondutor memory device which can detect defected cells in an early stage and increase a yield by applying a stress to bit lines in a wafer state to detect the defected cells and repairing them.

A wafer burn-in circuit for a semiconductor memory device capable of detecting defected cells by applying a stress to bit lines in a wafer state to detect the defected cells and repair them according to the present invention is defined by the claims with a specific embodiment shown in the attached drawings. For the purpose of summarizing the invention, a wafer burn-in circuit for a semiconductor memory device according to the invention includes an equalizing means for bit line for equalizing said bit lines at a standby Operation stage, wherein the equalizing means for bit line is controlled by a first precharge signal for bit line.

A stress inputting means for bit line is provided to input a stress voltage to the bit lines at a wafer burn-in operation stage, wherein the stress inputting means for bit line is controlled by a second precharge signal for bit line. A stress transferring means for bit line is also provided to make its output to be in a floating state at an normal operation stage, whereas it outputs a stress voltage to the stress inputting means for bit lines at the wafer burn-in operation stage.

Preferably, the first and second precharge signals for bit line have oppositing values relative to each other depending on a wafer burn-in operation mode in the wafer burn-in operation stage.

More preferably, the stress voltage is an external voltage supplied from the external at the wafer burn-in operation stage.

BRIEF DESCRIPTION OF THE DRAWINGS

For fuller understanding of the nature and objects of the invention, reference should be made to the following detailed description taken in conjunction with the accompanying drawing in which.

The operation of the Preferred embodiment of the present invention as discussed above will now be described in detail

DETAILED DESCRIPTION OF THE INVENTION

Figure 1:
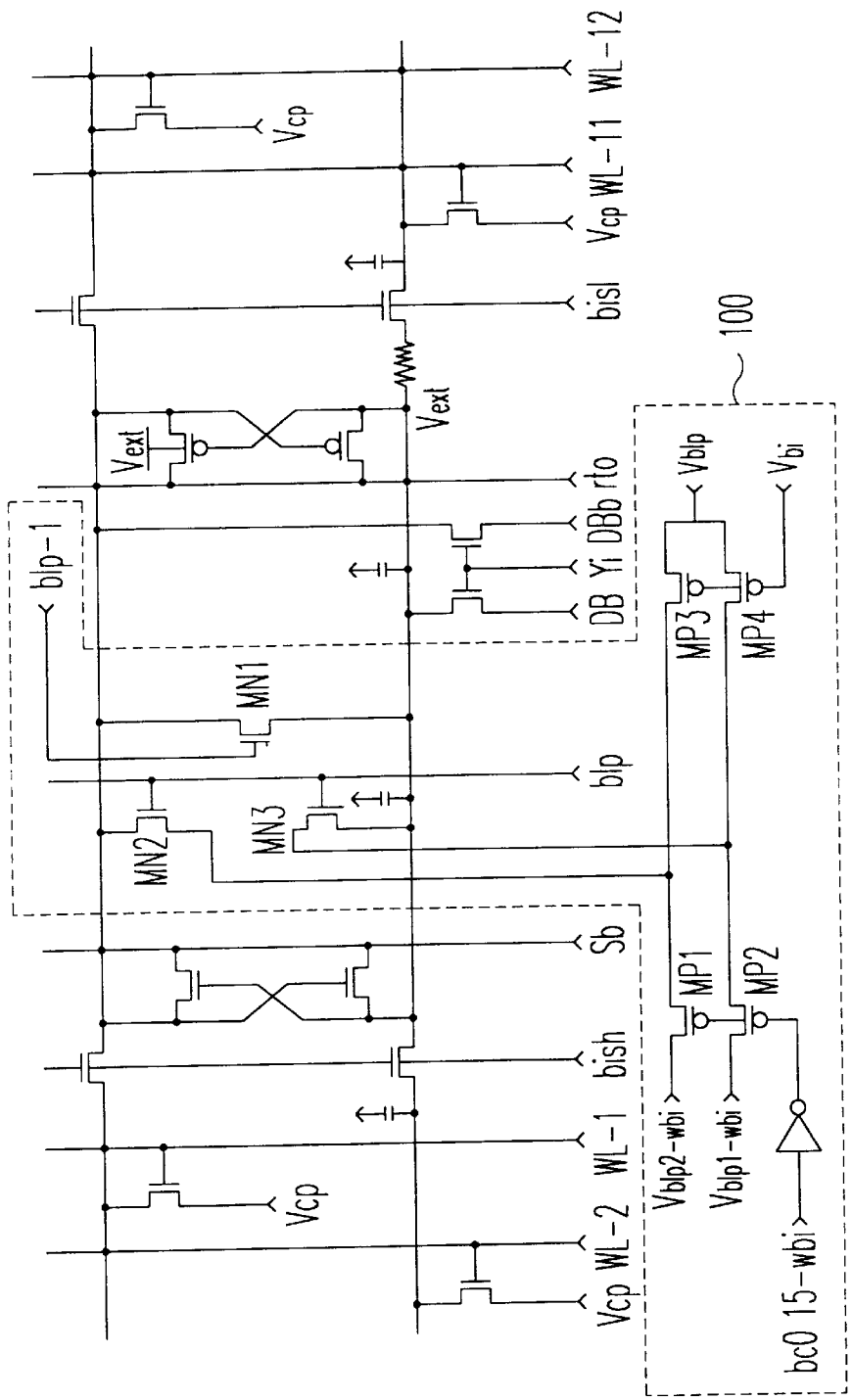
FIG. 1 partially represents a circuit illustrating a DRAM with a wafer burn-in circuit for a semiconductor memory device for applying a stress voltage to bit lines at a wafer burn-in operation mode according to the embodiment of the present invention.

Referring now to FIG. 1. it partially represents a circuit illustrating a DRAM with a wafer burn-in circuit for a semiconductor memory device for applying a stress voltage to bit lines at a wafer burn-in operation mode according to the embodiment of the present invention.

In the drawing, an equalizing means for bit line for equalizing said bit lines at a standby operation stage is shown. The equalizing means for bit line MN1 is controlled by a first precharge signal for bit line blp__1. Shown is a stress inputting means for bit line MN2 and MN3 for inputting a stress voltage Vblp1__wbi and vblp2__wbi to the bit lines at a wafer burn-in operation stage. Here, the stress inputting means for bit line MN2 and MN3 is controlled by a second precharge signal for bit line blp. A stress transferring means for bit line MP1 to MP4 is also provided to make its output to be in a floating state at an normal operation stage, whereas it outputs a stress voltage to the stress inputting means for bit lines at the wafer burn-in operation stage.

Figure 2:
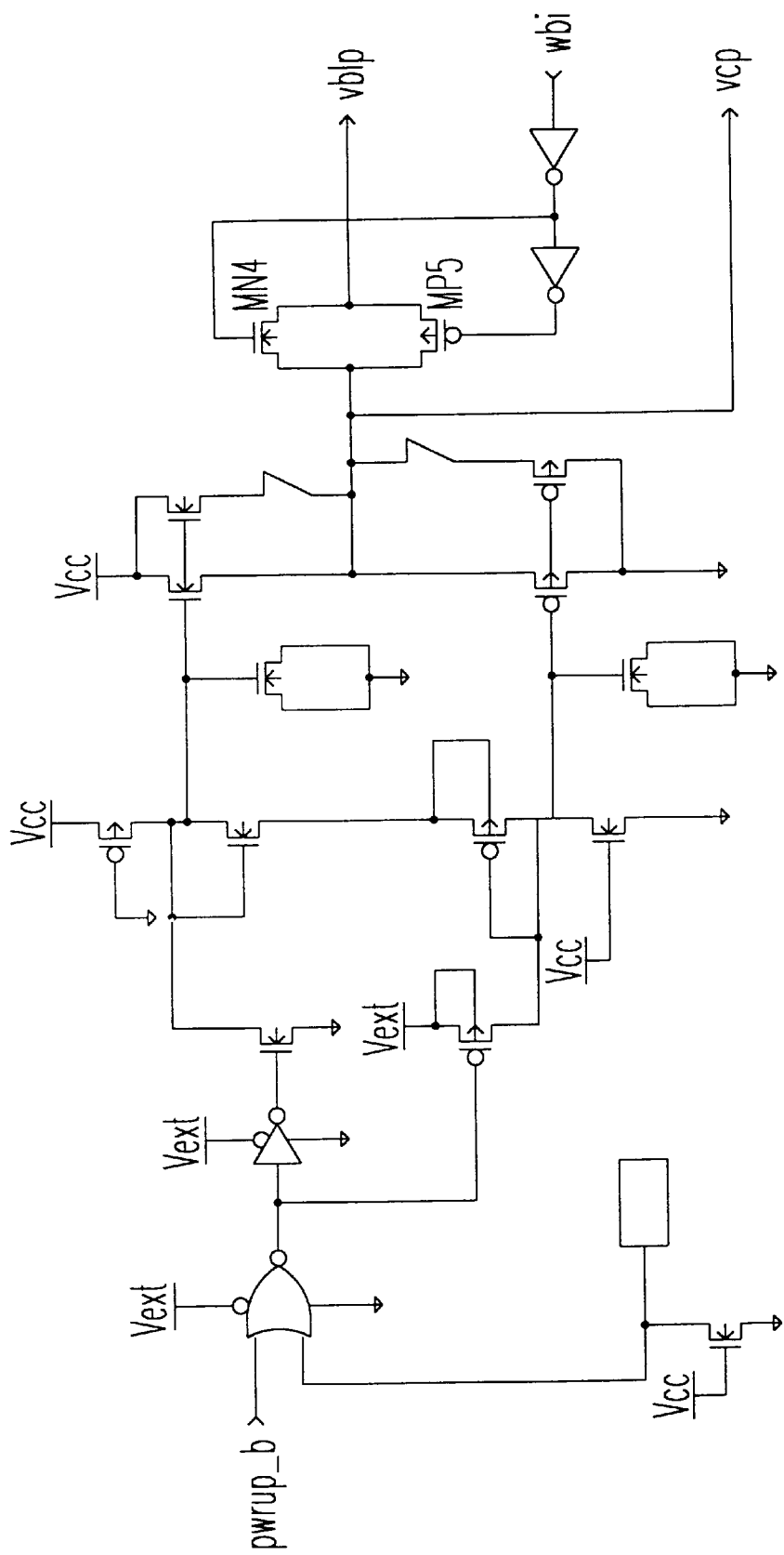
FIG. 2 illustrates a circuit for generating a precharge voltage shown in FIG. 1 according to the present invention.
Figure 3:
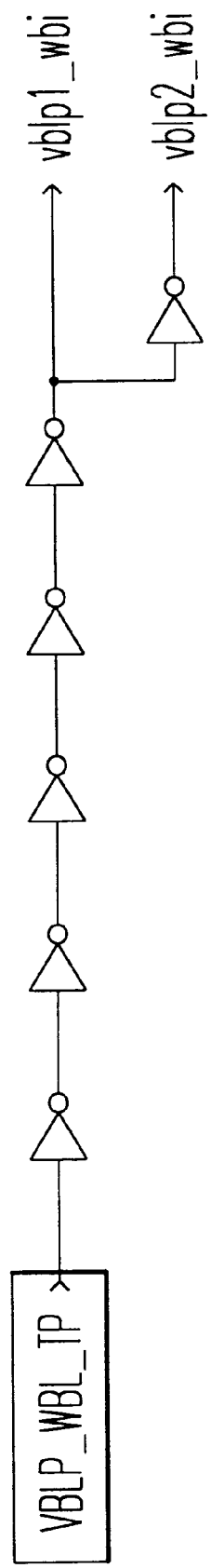
FIG. 3 shows a circuit for generating a stress voltage for bit line shown in FIG. 1 according to the present invention.
Figure 4:
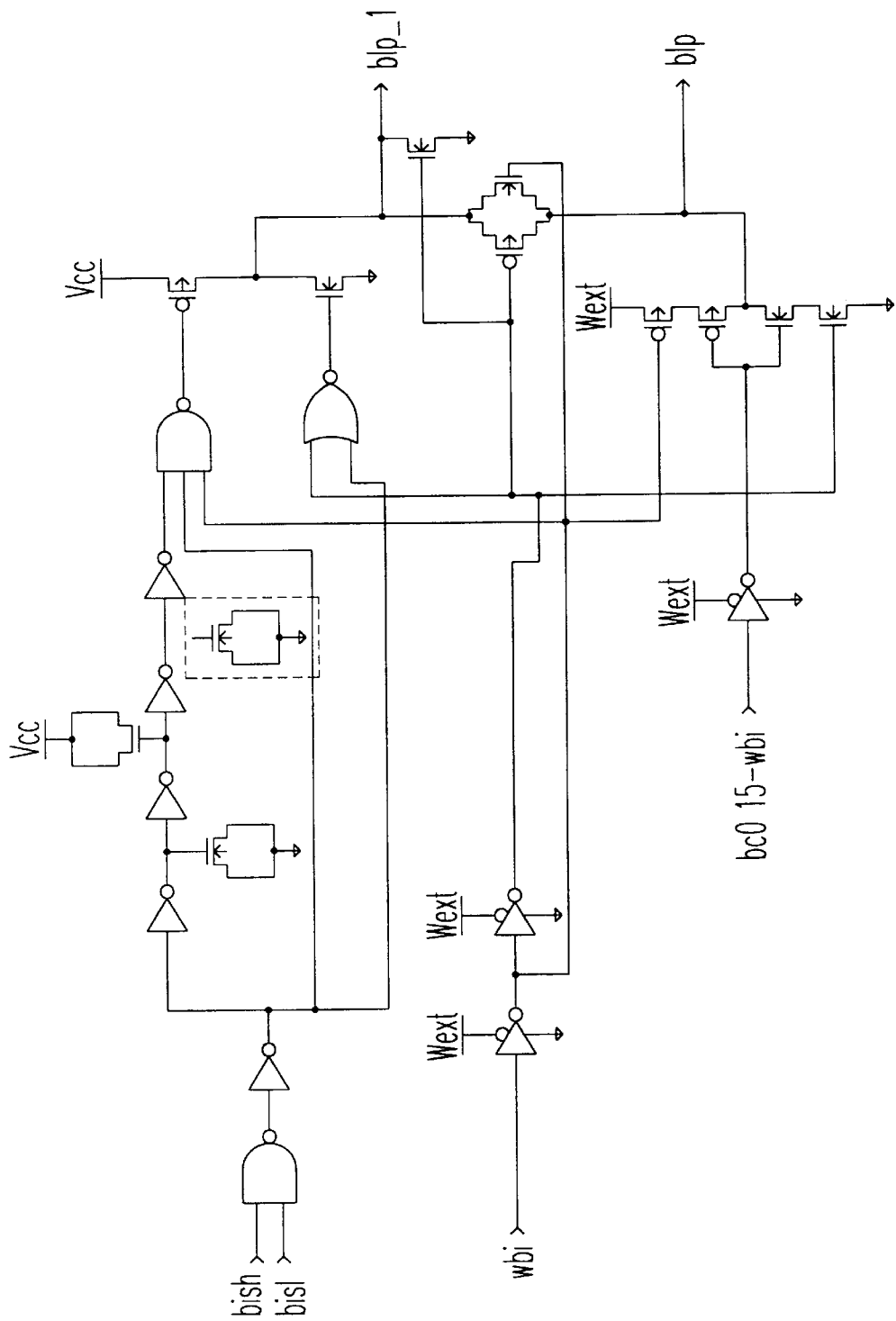
FIG. 4 depicts a circuit for generating first and second precharge signals for bit line shown in FIG.1 according to the present invention.

The operation of the circuit according to the preferred embodiment of the present invention as discussed above is controlled by a control signal generated from the circuits shown in FIGS. 2 to 4 and thus will row be described in detail.

In FIG. 2, it illustrates a circuit for generating the precharge voltage Vblp shown in FIG. 1 according to the present invention, in which it is so constituted that an external power supply voltage is output at the wafer burn-in operation mode and its output is to be in a floating state at an normal operation stage.

Here, "wbi" defines a wafer burn-in signal, where it has a high level at the wafer burn-in operation mode and a low level at the normal operation stage. "Vblp" represents a precharge signal for bit line for varying a voltage for the bit line. The "Vblp" signal has an external voltage supplied from the external only at the wafer burn-in operation mode, whereas it maintains the floating state at a state other than the wafer burn-in operation mode. "Vcp" is a precharge signal for bit line signal, where it has a level equal to the previous original level at the normal operation stage, whereas it maintains a half potential (½ Vcc) at the wafer burn-in operation mode.

FIG. 3 shows a circuit for generating the stress voltage for bit line shown in FIG. 1 according to the present invention, in which first and second stress voltages Vblp1__wbi and Vblp2__wbi are produced by the precharge voltages for bit line Vblp generated from the circuit in FIG. 2. The first and second stress voltages Vblp1__wbi and Vblp2__wbi have al oppositing voltage relative to each other for applying a stress to the bit line at the wafer burn-in operation mode, that is, a voltage of which the precharge voltages for bit line Vblp is delayed by a predetermined period.

In FIG. 4, it depicts a circuit for generating the first and second precharge signal for bit line shown in FIG. 1. "bish and bisl"show control signals for controlling the operation of a separating transistor for bit line shown in FIG. 1 wafer burn-in signal, in which they have high levels at the normal operation mode and low levels at the wafer burn-in operation mode, respectively, which cause the bit lines to be separated. The first and second precharge signals for bit line b1p__1 and b1p are then varied depending on the state of the wafer burn-in signal wbi. Since the wafer burn-in signal wbi has a high level, the first precharge signal for bit line blp__1 becomes a low level and the second precharge signal for bit line b1p becomes a high level, respectively: Thus, the equalizing circuit section MNl shown in FIG. 1 is turned-off, and the stress inputting circuit sections MN2 and MN3 are turned-on, such that the first and second stress voltages vblp1__wbi and vblp2__wbi generated from the circuit for generating the stress voltage for bit line shown in FIG. 3 are transferred to the bit lines.

Figure 5A:
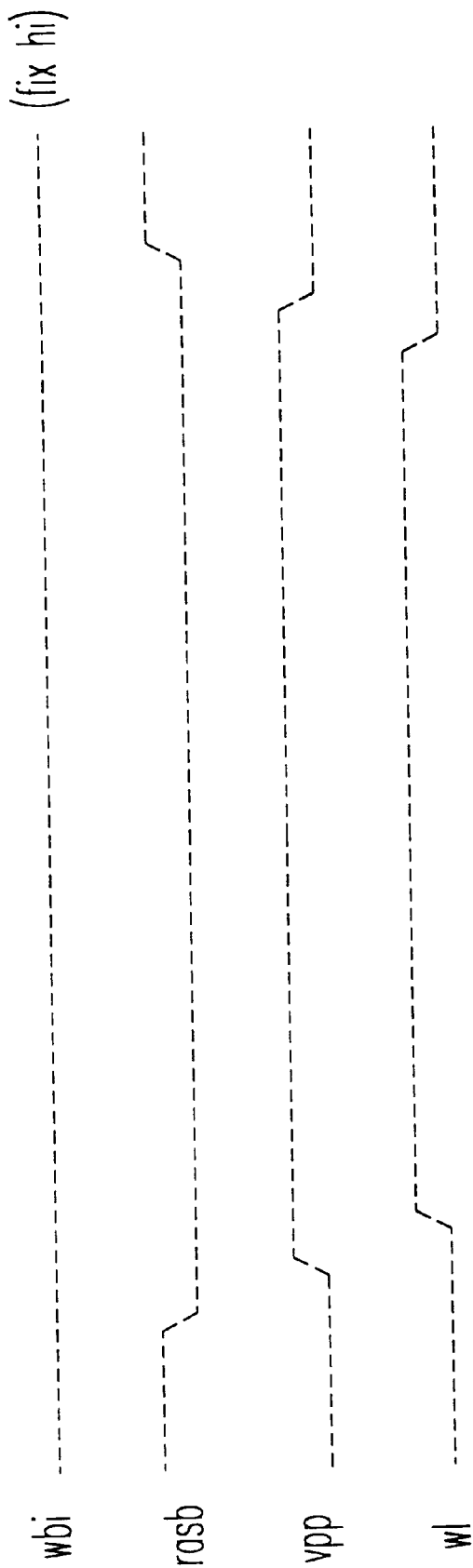
FIG. 5A is operational timing waveforms for explaining the operation of the conventional circuit which applies a stress voltage to the word lines of the semiconductor memory device: and, FIG. 5B is operational timing waveforms for explaining the operation of the circuit according to the present invention.
Figure 5B:
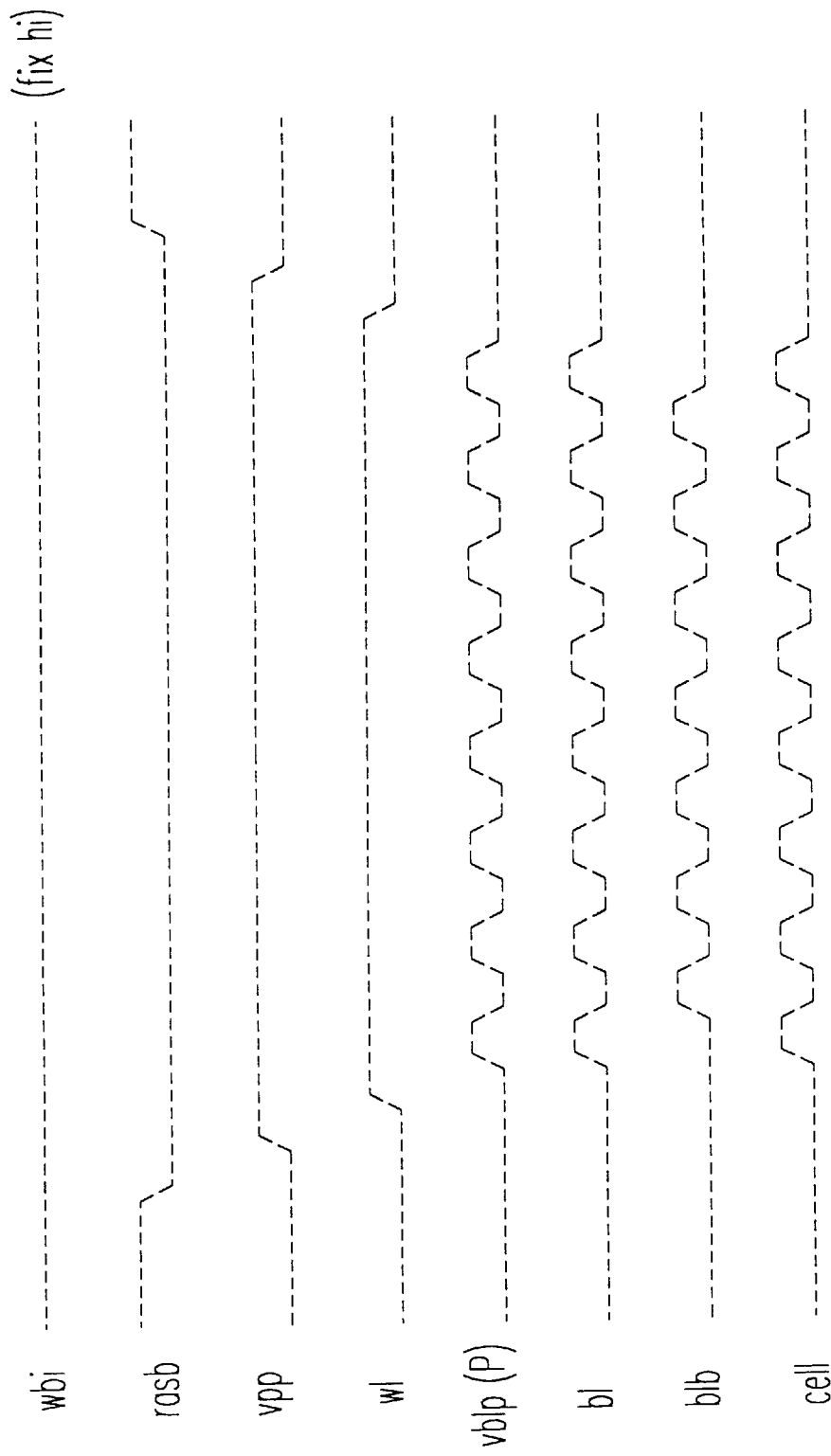

FIG. 5A is operational timing waveforms for explaining the operation of the conventional circuit which applies a stress voltage to the word lines of the semiconductor memory device, and FIG. 5B is operational timing waveforms for explaining the operations of the circuit according to the present invention, respectively.

As fully appreciated from FIG. 5A, it is understood that the bit lines and cell in the conventional semiconductor device are not under the influence of the stress voltage applied from the external, but only the word lines thereof is under the influence of the burn-in voltage.

In contrast to the above, according to the operational timing waveforms of the present invention shown in FIG. 5B, it is fully appreciated that the stress voltage can be applied to not only the word lines WL, but also the bit line BL, /BL and cell.

That is to say, the stress for bit line can vary the burn-in stress voltage by the external power source, not shown, and apply it to the word lines.

In addition, according to the present invention mentioned above, it is possible to vary the level for bit line using a test pad of the precharge voltage for bit line Vb1p and apply the stress to the bit line junction and cell transistor by effectuating such the level for bit line to vary the cell level through the cell transistor.

To more clearly explain the features of the present invention, the operation of the embodiment according to the present invention will be briefly described with reference to the normal operation mode and the wafer burn-in operation mode, respectively.

Referring again to FIG. 4, in the normal operation mode, since the wafer burn-in signal wbi is in low state, and in the standby mode (RASb PAD =high), the block control signals bish and bisl is in high state, the first precharge signal for bit line blp__1 become a high level, so that it equalizes the bit lines into the precharge potential level. When one of the block control signals bish and bisl become a low state according to the block address so selected, the first precharge signal for bit line blp__1 become a low level, so that it maintains the bit lines to be in the floating state. If the word lines become active, the cell data is transferred to the bit line BL and /BL, so that the sensing is achieved.

Referring also to FIG. 4, in the wafer burn-in operation mode, since the wafer burn-in signal wbi is in high state and the first precharge signal for bit line blp__1 become a low level, so that it separates the bit lines BL and /BL. Also, since the second precharge signal for bit line blp is always maintained in a high state, the Vblp1 and Vblp2 levels are transferred to the bit line BL and /BL. Therefore, upon applying the various condition to the Vblp test pad, the stress to the bit lines due to the change of Vblp1 and Vblp2 levels, and the stress due to the change of cell data can be applied.

As fully described above, when the wafer burn-in circuit according to the present invention is embodied inside the semiconductor memory device, there are advantageous effects which can detect defected cells in an early stage before performing the repairing process and increase a yield by applying a stress to bit lines in a wafer state to detect the defected cells and repair the same.

Although the present invention and its advantages have been described in detail, it should be understood that various changes, substitutions and alterations can be made herein without departing from the spirit and scope of the invention as defined by the appended claims.

What is claimed is:

1. A wafer burn-in circuit for a semiconductor memory device capable of detecting defective cells by applying a stress to bit lines in a wafer state to detect the defective cells and repair them the circuit comprising:

an equalizing means for equalizing said bit lines at a standby operation stage, said equalizing means being controlled by a first precharge signal;

a stress inputting means for inputting a stress voltage to said bit lines at a wafer burn-in operation stage, said stress inputting means being controlled by a second precharge signal;

a stress transferring means for outputting a stress voltage to said stress inputting means at the wafer burn-in operation stage;

wherein the stress voltage applied to said bit lines is alternately changed from high level to low level while word lines of the semiconductor memory device are activated.

2. A wafer burn-in circuit for a semiconductor memory device according to claim 1, wherein:

said first and second precharge signals have opposite values relative to each other depending on a wafer burn-in operation mode in said wafer burn-in operation stage.

3. A wafer burn-in circuit for a semiconductor memory device according to claim 1, wherein:

said stress voltage is an external voltage supplied at said wafer burn-in operation stage.

* * * * *